United States Patent
Park et al.

(10) Patent No.: US 7,923,316 B2
(45) Date of Patent: Apr. 12, 2011

(54) METHOD OF FORMING A POLYSILICON FILM AND METHOD OF MANUFACTURING A THIN FILM TRANSISTOR INCLUDING A POLYSILICON FILM

(75) Inventors: Kyung-bae Park, Seoul (KR); Takashi Noguchi, Seongnam-si (KR); Se-young Cho, Seoul (KR); Do-young Kim, Suwon-si (KR); Jang-yeon Kwon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 133 days.

(21) Appl. No.: 11/808,521

(22) Filed: Jun. 11, 2007

(65) Prior Publication Data

US 2007/0259487 A1 Nov. 8, 2007

Related U.S. Application Data

(62) Division of application No. 10/980,838, filed on Nov. 4, 2004, now Pat. No. 7,233,022.

(30) Foreign Application Priority Data

Nov. 4, 2003 (KR) .................. 10-2003-0077763

(51) Int. Cl.
*H01L 21/00* (2006.01)
(52) U.S. Cl. .......... 438/166; 257/E21.409; 257/E21.413
(58) Field of Classification Search .................. 438/166; 257/E21.409, E21.413
See application file for complete search history.

(56) References Cited

U.S. PATENT DOCUMENTS

| 5,313,076 A | 5/1994 | Yamazaki et al. |
| 5,583,369 A | 12/1996 | Yamazaki et al. |
| 5,693,545 A * | 12/1997 | Chung et al. .................. 438/49 |

(Continued)

FOREIGN PATENT DOCUMENTS

CN 1085352 A 4/1994

(Continued)

OTHER PUBLICATIONS

Korean Office Action dated Mar. 22, 2010 for corresponding Korean Application No. 10-2003-0077763 (with English-language translation).

*Primary Examiner* — Charles D Garber
*Assistant Examiner* — Stanetta D Isaac
(74) *Attorney, Agent, or Firm* — Harness, Dickey & Pierce, P.L.C.

(57) ABSTRACT

In a method of forming a polysilicon film, a thin film transistor including a polysilicon film, and a method of manufacturing a thin film transistor including a polysilicon film, the thin film transistor includes a substrate, a first heat conduction film on the substrate, a second heat conduction film adjacent to the first heat conduction film, the second heat conduction film having a lower thermal conductivity than the first heat conduction film, a polysilicon film on the second heat conduction film and the first heat conduction film adjacent to the second heat conduction film, and a gate stack on the polysilicon film. The second heat conduction film may either be on the first heat conduction film or, alternatively, the first heat conduction film may be non-contiguous and the second heat conduction film may be interposed between portions of the non-contiguous first heat conduction film.

20 Claims, 9 Drawing Sheets

U.S. PATENT DOCUMENTS

| | | | |
|---|---|---|---|
| 5,696,386 A | 12/1997 | Yamazaki | |
| 5,705,413 A * | 1/1998 | Harkin et al. | 438/155 |
| 5,946,561 A | 8/1999 | Yamazaki et al. | |
| 6,271,066 B1 | 8/2001 | Yamazaki et al. | |
| 6,376,290 B1 * | 4/2002 | Gosain et al. | 438/166 |
| 6,562,672 B2 | 5/2003 | Yamazaki et al. | |
| 6,570,223 B1 * | 5/2003 | Machida et al. | 257/347 |
| 6,794,277 B2 | 9/2004 | Machida et al. | |
| 6,964,890 B1 | 11/2005 | Yamazaki et al. | |
| 6,977,206 B2 * | 12/2005 | Huang et al. | 438/486 |
| 7,045,469 B2 * | 5/2006 | Sohn et al. | 438/758 |
| 7,071,083 B2 * | 7/2006 | Lin | 438/487 |
| 2001/0010391 A1 | 8/2001 | Nakajima et al. | |
| 2003/0008437 A1 | 1/2003 | Inoue et al. | |
| 2003/0155572 A1 | 8/2003 | Han et al. | |
| 2003/0173601 A1 * | 9/2003 | Machida et al. | 257/288 |
| 2004/0121529 A1 * | 6/2004 | Sohn et al. | 438/166 |
| 2004/0253797 A1 * | 12/2004 | Huang et al. | 438/486 |
| 2005/0079294 A1 * | 4/2005 | Lin et al. | 427/553 |
| 2005/0142707 A1 * | 6/2005 | Kim et al. | 438/166 |
| 2006/0043367 A1 * | 3/2006 | Chang et al. | 257/66 |

FOREIGN PATENT DOCUMENTS

| | | |
|---|---|---|
| JP | 05-206468 | 8/1993 |
| KR | 10-2001-0020826 | 3/2001 |
| KR | 10-2001-0030364 | 4/2001 |

* cited by examiner

METHOD OF FORMING A POLYSILICON FILM AND METHOD OF MANUFACTURING A THIN FILM TRANSISTOR INCLUDING A POLYSILICON FILM

CROSS REFERENCE TO RELATED APPLICATION(S)

This is a divisional application based on application Ser. No. 10/980,838, filed Nov. 4, 2004, now U.S. Pat. No. 7,233,022 the entire contents of which is hereby incorporated by reference.

BACKGROUND OF THE INVENTION

1. Field of the Invention

The present invention relates to a switching device for use in a flat display panel and a method of manufacturing the same. More particularly, the present invention relates to a method of forming a polysilicon film, a thin film transistor including the polysilicon film, and a method of manufacturing the thin film transistor.

2. Description of the Related Art

Thin film transistors are used as switching devices in flat display panels such as organic light emitting diodes (OLEDs) or liquid crystal displays (LCDs). A channel region of a thin film transistor can be composed of amorphous silicon or polysilicon.

On one hand, when a channel region of a thin film transistor is composed of amorphous silicon, uniformity of the channel region can be increased. However, due to low mobility of a carrier, it is difficult to attain high speed performance. On the other hand, when the channel region of a thin film transistor is composed of polysilicon, the mobility of a carrier can be greater than in a channel region composed of amorphous silicon.

When the channel region of a thin film transistor is composed of polysilicon, the polysilicon that constitutes the channel region is formed by crystallizing the amorphous silicon. The method of crystallizing the amorphous silicon can be categorized into an excimer laser method (ELA) and a solid phase crystallization method (SPC). Of the two crystallization methods, presently, the ELA method is widely used, because the ELA method has a lower thermal budget and provides a greater field effect mobility. However, using the conventional ELA crystallization method, it is difficult to produce crystals grain sizes larger than 0.5 µm, to obtain uniform grain size and to control a position on which the crystal is formed.

Accordingly, new methods of crystallization such as a sequential lateral solidification (SLS) method, an optical phase shift mask (OPSM) method, and a pre-patterned laser beam mask (PLBM) method, have been introduced. However, these methods require a correct substrate control device and require multiple pulses of a laser beam. Therefore, there are difficulties in applying these new methods to the present process for forming thin film transistors.

SUMMARY OF THE INVENTION

The present invention is therefore directed to a method of forming a polysilicon film, a thin film transistor including the polysilicon film, and a method of manufacturing the thin film transistor, which substantially overcome one or more of the problems due to the limitations and disadvantages of the related art.

It is a feature of an embodiment of the present invention to provide a method of forming a polysilicon film having larger grain sizes than in conventional films and high uniformity of grain location.

It is another feature of an embodiment of the present invention to provide a thin film transistor that has a channel region formed of polysilicon having larger grain sizes than in conventional thin film transistors and high uniformity of grain location.

It is still another feature of an embodiment of the present invention to provide a thin film transistor having high field effect mobility.

It is yet another feature of an embodiment of the present invention to provide a thin film transistor that can be formed on a variety of substrates.

It is still yet another feature of an embodiment of the present invention to provide a method of manufacturing a thin film transistor that is able to easily control grain sizes formed in a channel region of a polysilicon film and provide increased uniformity of grain location.

It is a further feature of an embodiment of the present invention to provide a simplified method of manufacturing a thin film transistor that can is able to omit use of a conventional substrate control device, thereby reducing manufacturing costs.

At least one of the above and other features and advantages of the present invention may be realized by providing a method of forming a polysilicon film including forming a lower film including a first heat conduction film and a second heat conduction film, the second heat conduction film having a lower thermal conductivity than the first heat conduction film, forming an amorphous silicon film covering the second heat conduction film and the first heat conduction film, and crystallizing the amorphous silicon film.

Forming the lower film may include depositing the second heat conduction film on a predetermined region of the first heat conduction film. Alternatively, forming the lower film may include replacing a portion of the first heat conduction film with the second heat conduction film.

The method may further include forming a capping film on the amorphous silicon film after forming the amorphous silicon film. Crystallizing the amorphous silicon film may include irradiating the amorphous silicon film with a laser beam having a predetermined energy density through the capping film. The method may further include removing the capping film after irradiating the amorphous silicon film.

Crystallizing the amorphous silicon film may include irradiating the amorphous silicon film with a laser beam having a predetermined energy density.

At least one of the above and other features and advantages of the present invention may be realized by providing a thin film transistor including a substrate, a first heat conduction film on the substrate, a second heat conduction film adjacent to the first heat conduction film, the second heat conduction film having a lower thermal conductivity than the first heat conduction film, a polysilicon film on the second heat conduction film and the first heat conduction film adjacent to the second heat conduction film, and a gate stack on the polysilicon film.

The second heat conduction film may be on the first heat conduction film. Alternatively, the first heat conduction film may be non-contiguous and the second heat conduction film may be interposed between portions of the non-contiguous first heat conduction film.

Crystals having grain sizes greater than about 0.5 µm may be formed in a portion of the polysilicon film on the second heat conduction film.

The first heat conduction film may be a film selected from the group consisting of an insulating film, a semiconductor film, a metal film, and a silicon carbide (SiC) film. The insulating film may be a film selected from the group consisting of an aluminum oxide ($Al_2O_3$) film, a strontium titanium oxide film ($SrTiO_3$) film, an aluminum nitride (AlN) film, and a silicon carbide (SiC) film. The metal film may be a film selected from the group consisting of an aluminum (Al) film, a copper (Cu) film, a cobalt (Co) film and a nickel (Ni) film.

The second heat conduction film may be a film selected from the group consisting of an organic material film and an inorganic material film. The organic material film may be a film selected from the group consisting of a poly acrylonitrite film, a poly methyl methacrylate (PMMA) film, a poly styrene film, a poly vinyl acetate film, a poly vinyl chloride film, a poly ethylene terephthalate (PET) film, and a hybrid silicon polymer film. The inorganic material film may be a film selected from the group consisting of a silicon oxide ($SiO_2$) film, a manganese oxide (MnO) film, an air film, and an aerogel film.

The substrate may be a film selected from the group consisting of a semiconductor substrate, a glass substrate, and a plastic substrate.

The thin film transistor may further include a buffer film interposed between the substrate and the first heat conduction film.

At least one of the above and other features and advantages of the present invention may be realized by providing a method of manufacturing a thin film transistor including forming a first heat conduction film on a substrate, forming a second heat conduction film adjacent to the first heat conduction film, the second heat conduction film having a lower thermal conductivity than the first heat conduction film, forming an amorphous silicon film covering the second heat conduction film and the first heat conduction film, transforming the amorphous silicon film into a polysilicon film, and forming a gate stack on the polysilicon film formed on the second heat conduction film.

Forming the second heat conduction film adjacent to the first heat conduction film may include forming the second heat conduction film on a predetermined region of the first heat conduction film. Alternatively, forming the second heat conduction film adjacent to the first heat conduction film may include replacing a portion of the first heat conduction film with the second heat conduction film, thereby forming a non-contiguous first heat conduction film.

Replacing the portion of the first heat conduction film with the second heat conduction film may include forming a photo-sensitive pattern exposing a portion of the first heat conduction film on the first heat conduction film, removing the exposed portion of the first heat conduction film to form the non-contiguous first heat conduction film, forming the second heat conduction film in the portion where the exposed portion of the first heat conduction film is removed, and removing the photo-sensitive pattern.

The method may further include forming a buffer film between the substrate and the first heat conduction film. The method may further include forming a capping film on the amorphous silicon film.

Transforming the amorphous silicon film into the polysilicon film may include irradiating the amorphous silicon film with a single pulse of a laser beam having a predetermined energy density. Transforming the amorphous silicon film into the polysilicon film may include irradiating the amorphous silicon film with a single pulse of a laser beam having a predetermined energy density through the capping film.

The method may further include removing the capping film after irradiating the amorphous silicon film.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
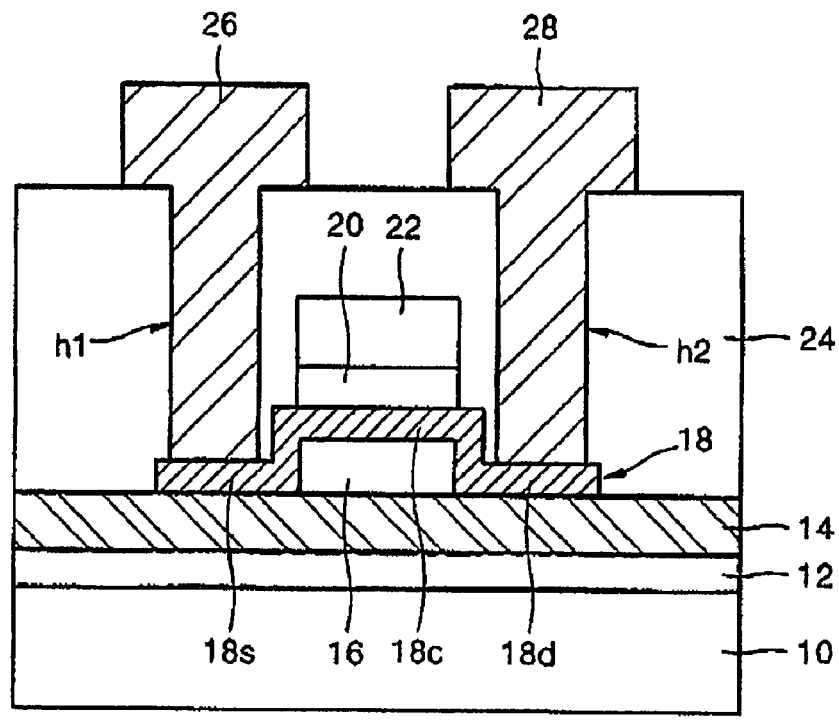
FIG. 1 illustrates a cross-sectional view of a thin film transistor according to a first embodiment of the present invention.

Korean Patent Application No. 2003-77763, filed on Nov. 4, 2003, in the Korean Intellectual Property Office, and entitled: "Method of Forming Polysilicon Film, Thin Film Transistor Comprising Polysilicon Film and Method of Manufacturing the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

First Embodiment

A thin film transistor according to the first embodiment of the present invention will now be described.

FIG. 1 illustrates a cross-sectional view of a thin film transistor according to the first embodiment of the present invention.

Referring to FIG. 1, a buffer film 12 with a thickness of about 6000 Å and a first heat conduction film 14 having high thermal conductivity and a thickness of about 1000 Å are sequentially formed on a substrate 10. The substrate 10 may be formed of a semiconductor, glass, or plastic. The buffer film 12 blocks impurities included in the substrate 10 from migrating from the substrate 10 into elements formed above the buffer film 12 during formation of a thin film transistor on the buffer film 12. The first heat conduction film 14 may be one selected from the group consisting of an insulating film, a semiconductor film, and a metal film. When the first heat conduction film 14 is an insulating film, the first heat conduction film 14 may be an oxide film, such as an aluminum oxide film ($Al_2O_3$) or a strontium titanium oxide film ($SrTiO_3$), or a nitride film, such as an aluminum nitride film (AlN). When the first heat conduction film 14 is a metal film, the first heat conduction film 14 may be one selected from the group consisting of an aluminum (Al) film, a copper (Cu) film, a cobalt (Co) film, and a nickel (Ni) film. The first heat conduction film 14 may also be a different material film, such as a silicon carbide (SiC) film.

A second heat conduction film 16 is disposed on a predetermined portion of the first heat conduction film 14. The second heat conduction film 16 is formed of a material having a lower thermal conductivity than the first heat conduction film 14. The second heat conduction film 16 may be an organic material film or an inorganic material film. When the second heat conduction film 16 is an organic material film, the second heat conduction film 16 may be a poly acrylonitrite film, a poly methyl methacrylate (PMMA) film, a poly styrene film, a poly vinyl acetate film, a poly vinyl chloride film, a poly ethylene terephthalate (PET) film or a hybrid silicon polymer film. When the second heat conduction film 16 is an inorganic material film, it may be one selected from the group consisting of a silicon oxide ($SiO_2$) film, a manganese oxide (MnO) film, an air film, and an aerogel film.

A polysilicon film 18 covering the second heat conduction film 16 is formed on the first heat conduction film 14. The polysilicon film 18 is symmetrical about the second heat conduction film 16. The polysilicon film 18 is divided into a source region 18s disposed on one side of the second heat conduction film 16, a drain region 18d disposed on the opposite side of the second heat conduction film 16, and a channel region 18c disposed on an upper surface of the second heat conduction film 16. At this time, grain sizes in the channel region 18c of the polysilicon film 18 may be greater than about 0.5 µm, as illustrated in FIGS. 14 through 19. Accordingly, much greater field effect mobility than was conventionally possible can be obtained in the channel region 18c.

A gate insulating film 20 and a gate electrode 22 are sequentially formed on the channel region 18c. The first heat conduction film 14, the polysilicon film 18, the gate electrode 22, and the gate insulating film 20 are covered by an interlayer insulating film 24. A first contact hole h1 that exposes the source region 18s and a second contact hole h2 that exposes the drain region 18d are formed in the interlayer insulating film 24. A first electrode 26 that fills the first contact hole h1 and a second electrode 28 that fills the second contact hole h2 are formed on the interlayer insulating film 24.

Second Embodiment

A thin film transistor according to the second embodiment of the present invention will now be described. Descriptions of elements substantially similar to those described in connection with the first embodiment will not be repeated.

Figure 2:
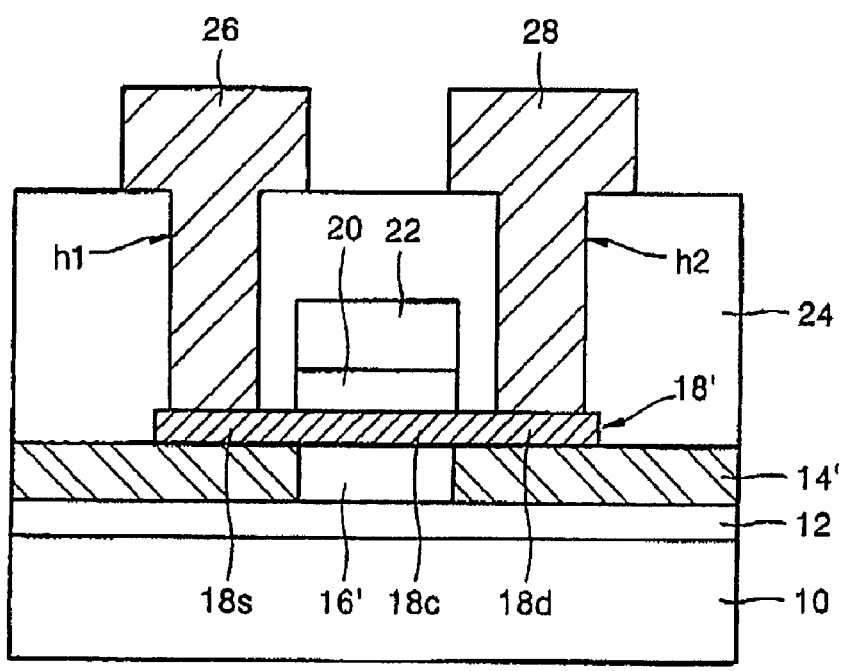
FIG. 2 illustrates a cross-sectional view of a thin film transistor according to a second embodiment of the present invention.

FIG. 2 illustrates a cross-sectional view of a thin film transistor according to the second embodiment of the present invention.

Referring to FIG. 2, the buffer film 12 is on the substrate 10. A non-contiguous first heat conduction film 14' is disposed on the buffer film 12. A second heat conduction film 16' with a thickness equal to a thickness of the non-contiguous first heat conduction film 14' is interposed between portions of the first heat conduction film 14'. A polysilicon film 18' covering the whole surface of the second heat conduction film 16' is deposited on the non-contiguous first heat conduction film 14'. The polysilicon film 18', in a region where it contacts the second heat conduction film 16', i.e., the channel region 18c, is formed of polysilicon having much greater grain sizes than in the conventional art.

The gate insulating film 20 and the gate electrode 22 are sequentially formed on the channel region 18c. The interlayer insulating film 24 covers the non-contiguous first heat conduction film 14', the gate electrode 22, the gate insulating film 20, and the polysilicon film 18'. The first and second contact holes h1 and h2 are formed in the interlayer insulating film 24. The source region 18s of the polysilicon film 18' is exposed by the first contact hole h1, and the drain region 18d is exposed by the second contact hole h2. The first electrode 26 filling the first contact hole h1 and the second electrode 28 filling the second contact hole h2 are deposited on the interlayer insulating film 24.

As an alternative to the above-described first and second embodiments, a thin film transistor (TFT) such as a bottom TFT in which the gate electrode 22 is formed under the channel region 18c, as opposed to on the channel region 18c as in the thin film transistors according to the first and second embodiments of the present invention, may be formed. In the case of the bottom TFT, the gate electrode 22 may be disposed between the first heat conduction film 14 or 14' and the second heat conduction film 16 or 16'.

First Embodiment

A method of manufacturing a thin film transistor according to the first embodiment of the present invention will now be described.

Figure 3:
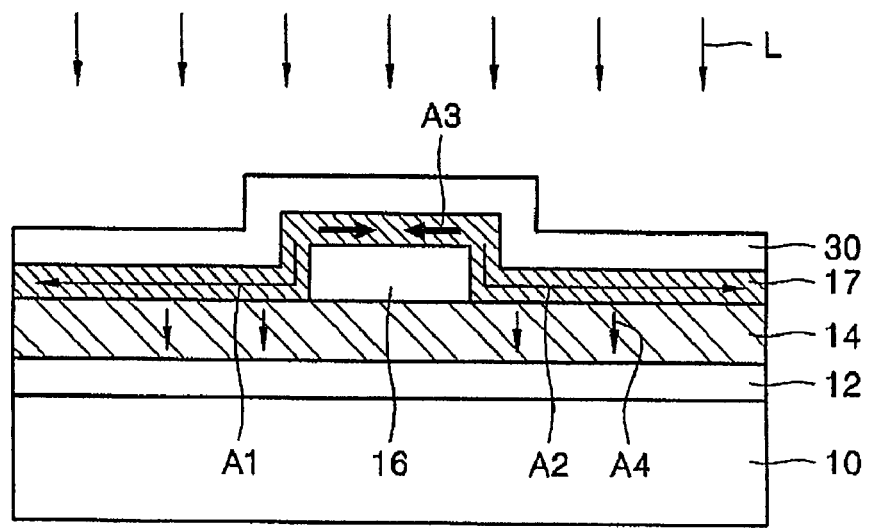
FIGS. 3 though 6 illustrate cross-sectional views of stages in a method of manufacturing the thin film transistor shown in FIG. 1.

FIGS. 3 though 6 illustrate cross-sectional views of stages in a method of manufacturing the thin film transistor shown in FIG. 1.

Referring to FIG. 3, the buffer film 12 and the first heat conduction film 14 are sequentially formed on the substrate 10. The substrate 10 may be formed of semiconductor, glass, or plastic. The buffer film 12 may be formed of a silicon oxide film. In this case, the buffer film 12 may be formed to a thickness of about 6000 Å. The buffer film 12 blocks impurities from migrating from the substrate 10 into elements above the buffer film 12 in a subsequent process. The first heat conduction film 14 may be formed to a thickness of about 1000 Å by a reactive sputtering. The first heat conduction film 14 may be an insulating film, a semiconductor film, or a metal film, but in the present embodiment, it is exemplarily an insulating film. When the first heat conduction film 14 is an insulating film, the first heat conduction film 14 may be formed with an oxide film such as an $Al_2O_3$ film or a $SrTiO_3$ film, or a nitride film such as an AlN film, or a SiC film. When the first heat conduction film 14 is formed with a metal film, it may be one selected from the group consisting of an Al film, a Cu film, a Co film, and a Ni film.

The second heat conduction film 16 is formed on a predetermined region of the first heat conduction film 14. The first and second heat conduction films 14 and 16 will be a lower film formed of an amorphous silicon film. The second heat conduction film 16 is formed by performing a photolithography after depositing a material film on the upper surface of the first heat conduction film 14. At this time, the material film may be formed to a thickness of about 500 Å using an Inductively Coupled Plasma-Chemical Vapor Deposition (ICP-CVD) apparatus. The second heat conduction film 16 defines the channel region since the channel region is formed on the second heat conduction film 16 in a subsequent process.

After forming the second heat conduction film 16, an amorphous silicon film 17 with a thickness of about 500 Å is formed on the second heat conduction film 16 and the first heat conduction film 14. At this time, the amorphous silicon film 17 may be formed using sputtering or plasma enhanced CVD apparatus. A capping film 30 may be formed on the amorphous silicon film 17. The capping film 30, however, is not necessary, and may be omitted. The capping film 30 may be a silicon oxide film formed to a thickness of about 1000 Å using the ICP-CVD apparatus. After forming the capping film 30, a laser beam L having an energy density sufficient to reach the amorphous silicon film 17 through the capping film 30 is incident on an upper surface of the capping film 30. The laser beam L has an energy density of between about 240 to 280 $mJ/cm^2$. For example, the laser beam L may be generated using an XeCl excimer laser that generates a short pulse excimer laser beam having a 10 ns period, or using a Nd-YAG laser. A single pulse of the laser beam L may be used.

When the laser beam L is incident on the capping film 30, heat is generated from the entire area of the amorphous silicon film 17. As a result, the amorphous silicon film 17 is transformed into a polysilicon film. At this time, heat generated in a portion of the amorphous silicon film 17 deposited on the first heat conduction film 14, which has high thermal conductivity, rapidly dissipates in directions as indicated by first, second, and fourth arrows A1, A2, and A4. Heat generated in a portion of the amorphous silicon film 17 deposited on the second heat conduction film 16, which has low thermal conductivity, however, slowly dissipates due to the adiabatic effect of the second heat conduction film 16. For this reason, nucleation is formed at both edges of the amorphous silicon film 17 deposited on the second heat conduction film 16. The nucleation grows from the both sides of the amorphous silicon film 17 toward the inside of the amorphous silicon film 17, as indicated by third arrows A3, and develops grains. The grain growth begins at both edges of the amorphous silicon film 17 and continues until meeting on the second heat conduction film 16.

Figure 4:
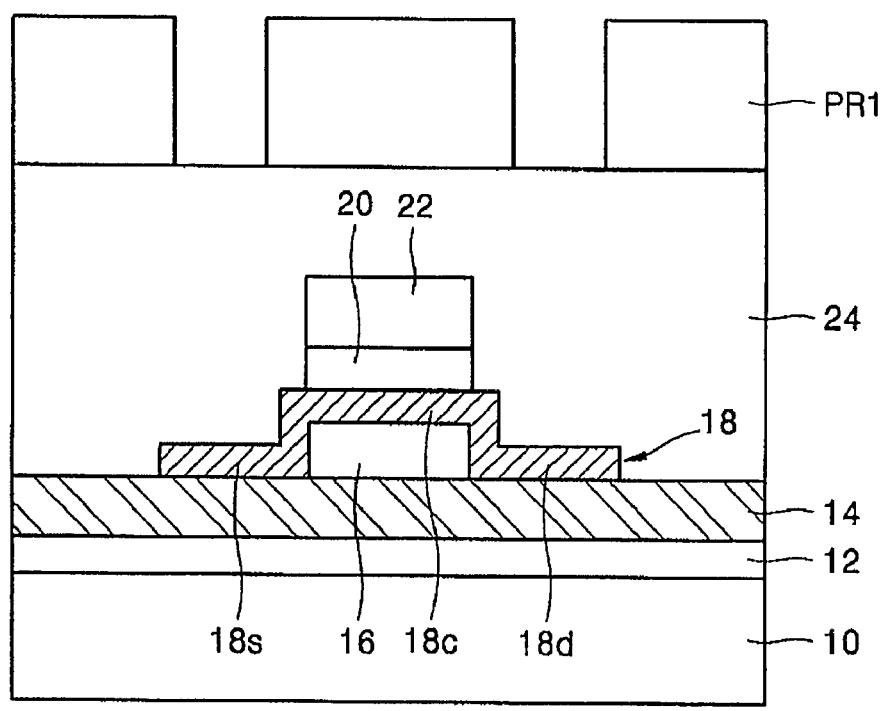

Referring to FIG. 4, the amorphous silicon film 17 is transformed into a polysilicon film 18 through the above described process, and much larger grain sizes (greater than about 0.5 μm) than were conventionally possible are formed in the channel region 18c, that is, the polysilicon film 18 deposited on the second heat conduction film 16. Because the formation of the polysilicon film 18 is performed at a low temperature of about 25-150° C., the substrate 10 may be formed of a silicon wafer, a metal foil, glass, or plastic.

After transforming the amorphous silicon film 17 into the polysilicon film 18, the capping film 30, if used, is removed.

The gate insulating film 20 and the gate electrode 22 are sequentially formed on the polysilicon film 18 deposited on the second heat conduction film 16. Subsequently, the interlayer insulating film 24 is formed on the gate electrode 22, the gate insulating film 20, the polysilicon film 18 and the first heat conduction film 14. A surface of the interlayer insulating film 24 is then planarized. A photo-sensitive pattern PR1 is formed on the interlayer insulating film 24. The photo-sensitive pattern PR1 exposes regions of the interlayer insulating film 24 corresponding to the source region 18s and the drain region 18d of the polysilicon film 18.

Figure 5:
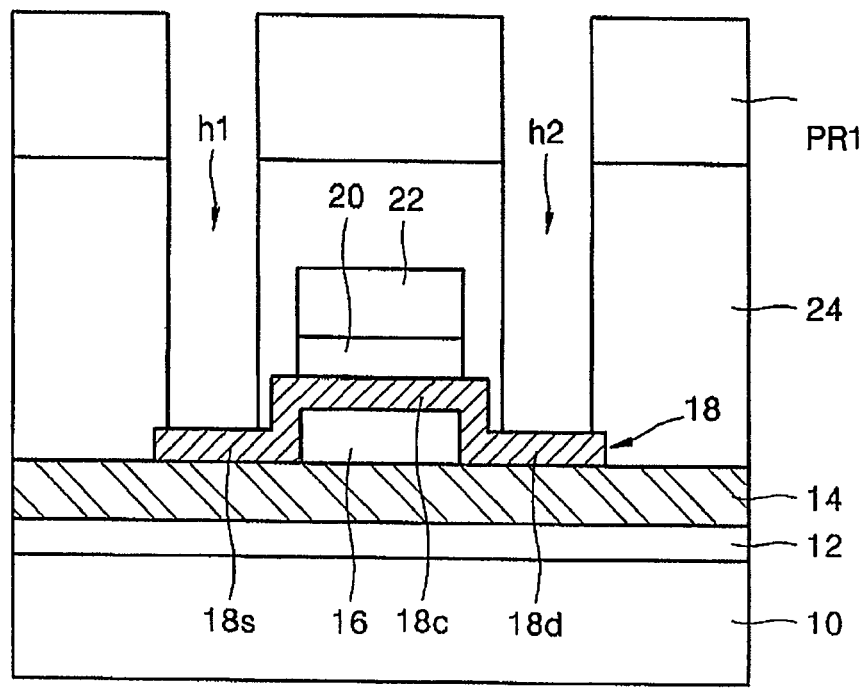

Referring to FIG. 5, after forming the photo-sensitive pattern PR1, the exposed portions of the interlayer insulating film 24 are etched using the photo-sensitive pattern PR1 as an etch mask. The etching is continued until the source and drain regions 18s and 18d of the polysilicon film 18 are exposed. Thus, the first contact hole h1 through which the source region 18s is exposed and the second contact hole h2 through which the drain region 18d is exposed are formed in the interlayer insulating film 24. After completion of the etching, the photo-sensitive pattern PR1 is removed.

Figure 6:
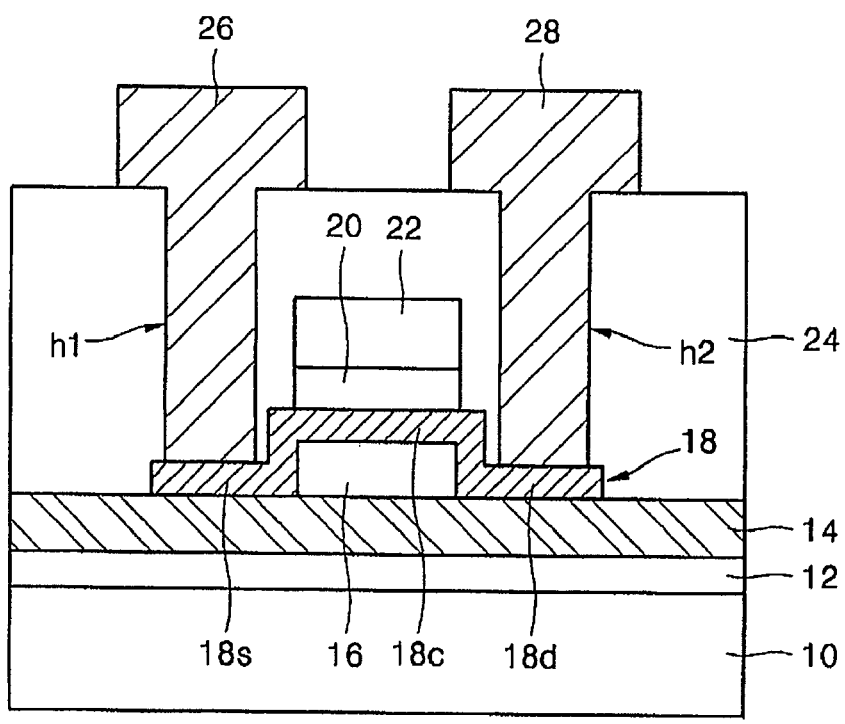

Referring to FIG. 6, after depositing a metal film (not shown) that fills the first contact hole h1 and the second contact hole h2 on the interlayer insulating film 24, the metal film is patterned to form the first electrode 26 that contacts the source region 18s and the second electrode 28 that contacts the drain region 18d using photolithography.

Second Embodiment

A method of manufacturing a thin film transistor according to the second embodiment of the present invention will now be described. Descriptions of aspects, steps and elements substantially similar to those described in connection with the first embodiment will not be repeated.

FIGS. 7 through 13 illustrate cross-sectional views of stages in a method of manufacturing the thin film transistor shown in FIG. 2.

Figure 7:
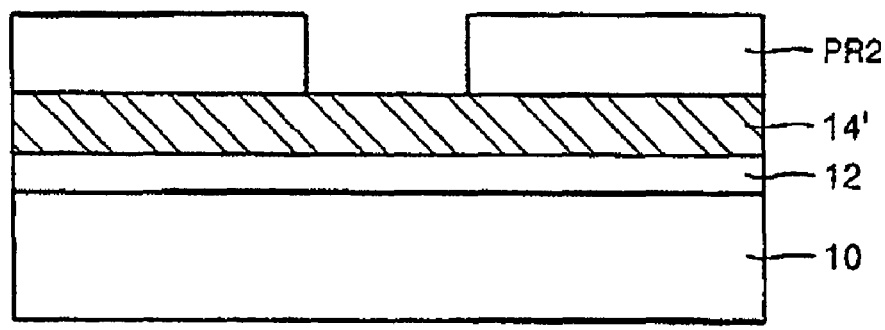
FIGS. 7 through 13 illustrate cross-sectional views of stages in a method of manufacturing the thin film transistor shown in FIG. 2.

Referring to FIG. 7, the buffer film 12 and the first heat conduction film 14' are sequentially formed on the substrate 10. A photo-sensitive pattern PR2 that exposes a predetermined portion of the first heat conduction film 14' is formed on the first heat conduction film 14'. The exposed portion of the first heat conduction film 14' is etched using the photo-sensitive pattern PR2 as an etch mask. The etching is continued until the buffer film 12 is exposed, thereby making the first conduction film 14' non-contiguous.

Figure 8:
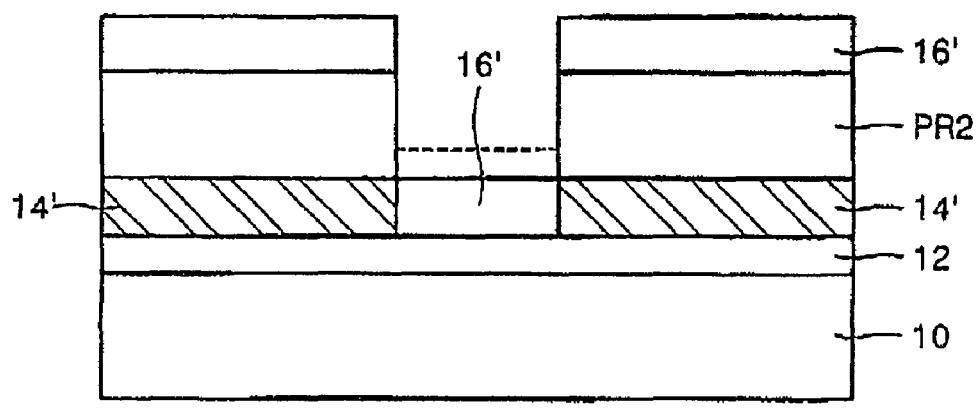
Figure 9:
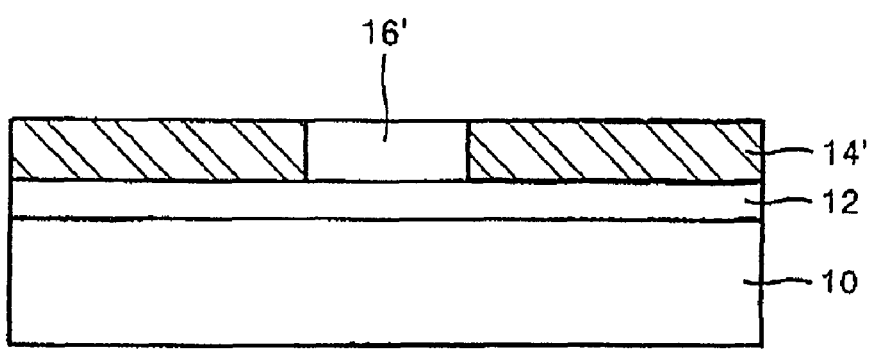

Referring to FIG. 8, after etching, the second heat conduction film 16' is formed on the exposed portion of the buffer film 12. At this time, it is preferable that the second heat conduction film 16' is formed to a thickness equal to that of the non-contiguous first heat conduction film 14' to completely fill the removed portion of the first heat conduction film 14'. However, the second heat conduction film 16' formed within the removed portion of the first heat conduction film 14' can be formed thicker than the first heat conduction film 14' provided that the second heat conduction film 16' formed on the photo-sensitive pattern PR2 does not contact the second heat conduction film 16' formed on the removed portion of the first heat conduction film 14'. After forming the second heat conduction film 16' where the first heat conduction film 14' was removed, the photo-sensitive pattern PR2 is ashed and stripped off. While removing the photo-sensitive pattern PR2, the second heat conduction film 16' formed on the photo-sensitive pattern PR2 is also removed. Referring to FIG. 9, the non-contiguous first heat conduction film 14' and the second heat conduction film 16' have the same plane after removing the photo-sensitive pattern PR2. The first and second heat conduction films 14' and 16' will be a lower film on which an amorphous material film will be formed.

Figure 10:
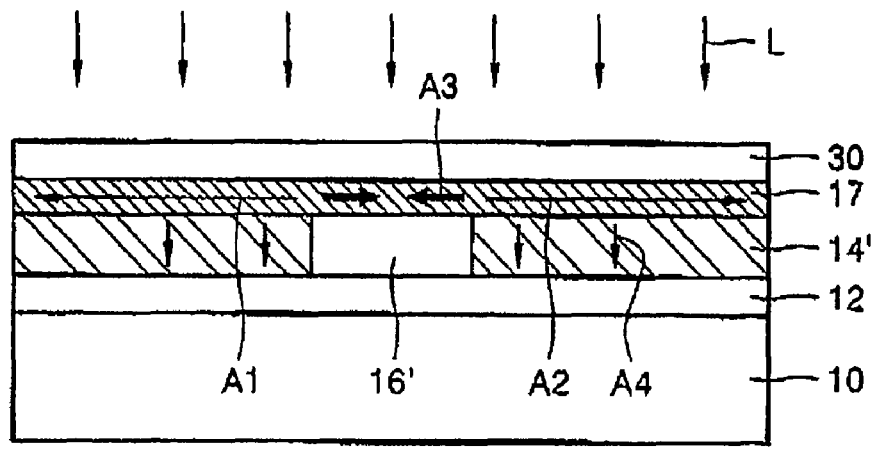

Referring to FIG. 10, the amorphous silicon film 17 is formed on the first and second heat conduction films 14' and 16', and the capping film 30 is formed on the amorphous silicon film 17. Next, the laser beam L is incident on the capping film 30, using a laser as described in connection with the first embodiment of the present invention.

Due to the laser beam L irradiation, the amorphous silicon film 17 is transformed into the polysilicon film 18' the channel region 18c of which has grain sizes greater than about 0.5 μm, which is larger than the size of conventional grains. The source region 18s and the drain region 18d together with the channel region 18c are defined in the polysilicon film 18'.

Arrows A1, A2, A3 and A4 of FIG. 10 are described above in connection with the first embodiment, and a discussion thereof will not be repeated.

The transformation of the amorphous silicon film 17 into the polysilicon film 18' by the laser beam L has been described above. After the laser beam L irradiation, the capping film 30, if used, is removed.

Figure 11:
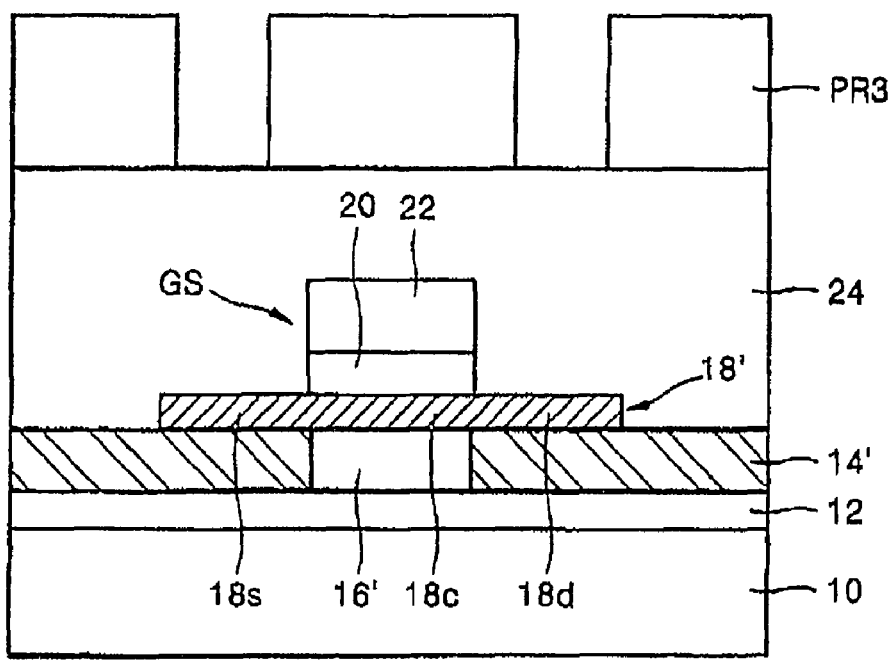

Referring to FIG. 11, a gate stack GS is formed on the polysilicon film 18' formed on the second heat conduction film 16'. The gate stack GS includes the gate insulating film 20 and the gate electrode 22, which are sequentially formed. The gate stack GS may alternatively be formed under the channel region 18c of the polysilicon film 18'.

Figure 12:
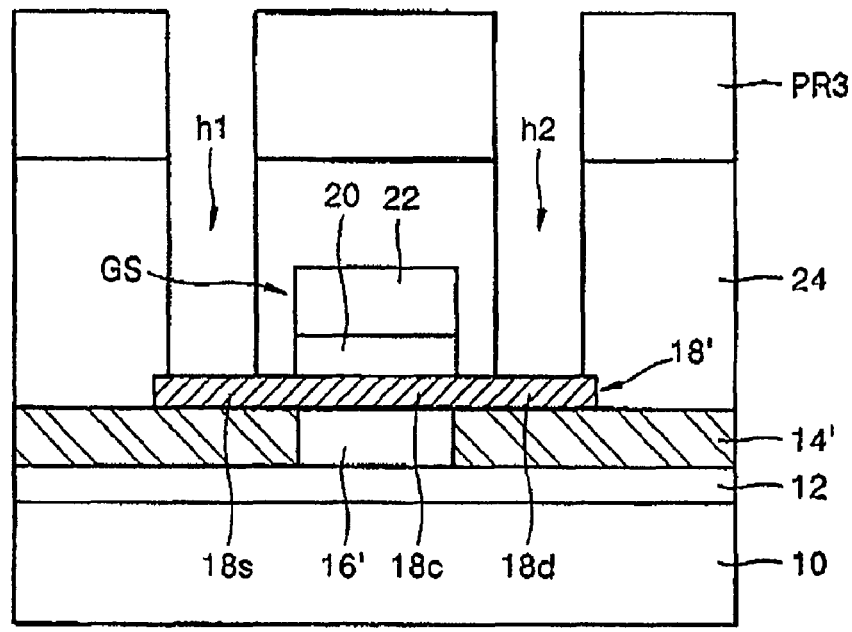
Figure 13:
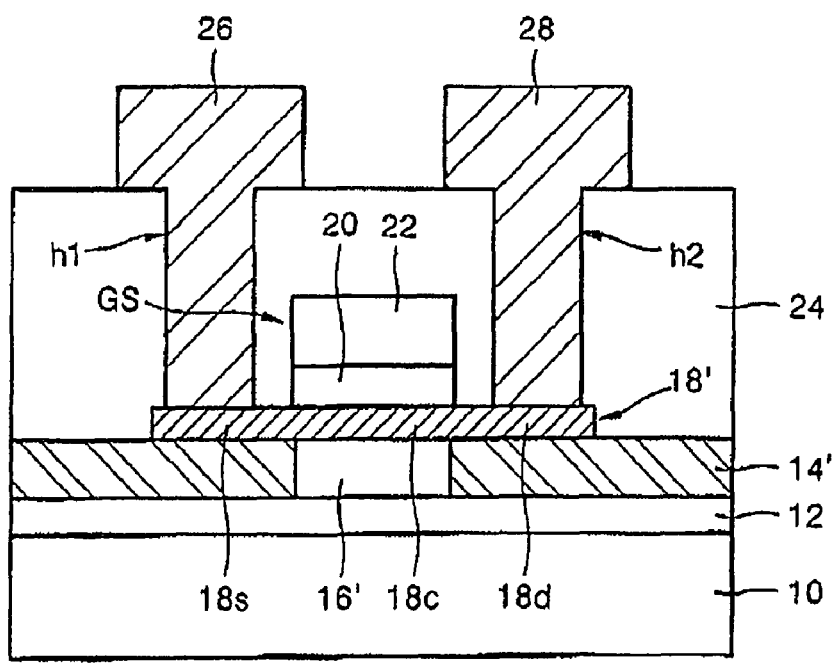

Next, the interlayer insulating film 24 is formed on the gate stack GS, the polysilicon film 18' and the first heat conduction film 14'. A photo-sensitive pattern PR3 is formed on the interlayer insulating film 24. The photo-sensitive pattern PR3 exposes portions of the interlayer insulating film 24 corresponding to the source and drain regions 18s and 18d. Referring to FIG. 12, after forming the photo-sensitive pattern PR3, the interlayer insulating film 24 is etched until the source and drain regions 18s and 18d of the polysilicon film 18' are exposed, using the photo-sensitive pattern PR3 as an etch mask. Thus, the first contact hole h1 through which the source region 18s is exposed and the second contact hole h2 through which the drain region 18d is exposed are formed in the interlayer insulating film 24. Subsequently, the first electrode 26 that contacts the source region 18s and the second electrode 28 that contacts the drain region 18d are formed on the interlayer insulating film 24, as shown in FIG. 13.

Experiments measuring the grain size of the polysilicon film 18 or 18' used as the channel region in the TFT, and a relationship between the energy density of the laser beam L incident on the amorphous silicon film 17 and the grain size formed in the channel region 18c of the polysilicon film 18 or 18' were performed. For these experiments, a plurality of amorphous silicon films, which are equivalent to the amorphous silicon films 17 described above, were prepared, and capping films were formed on the prepared amorphous silicon films. Further, a single pulse from an excimer laser having a different energy density was incident on each of the prepared amorphous silicon films through the capping film.

FIGS. 14 through 19 are SEM images of channel regions of the plurality of polysilicon films formed in the above-described experiments. In FIGS. 14 through 19, reference character NA represents an edge of the channel region, reference number 100 represents nucleation formed randomly at the edge of the channel region, and reference character SL represents a diameter of the grain formed in the channel region.

Figure 14:
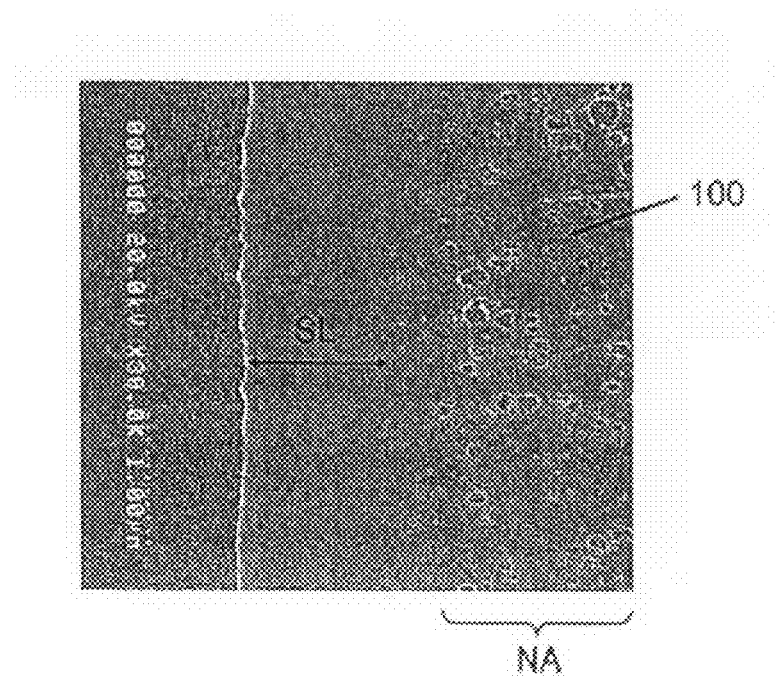
FIGS. 14 through 19 are scanning electron microscope (SEM) images of crystals formed in channel regions of polysilicon films formed according to an embodiment of the present invention.

FIG. 14 is a SEM image of a channel region of a polysilicon film formed by irradiating the amorphous silicon film with an excimer laser beam having an energy density of 240 mJ/cm$^2$. In this case, the grain size formed in the channel region is approximately 0.8 μm.

Figure 15:
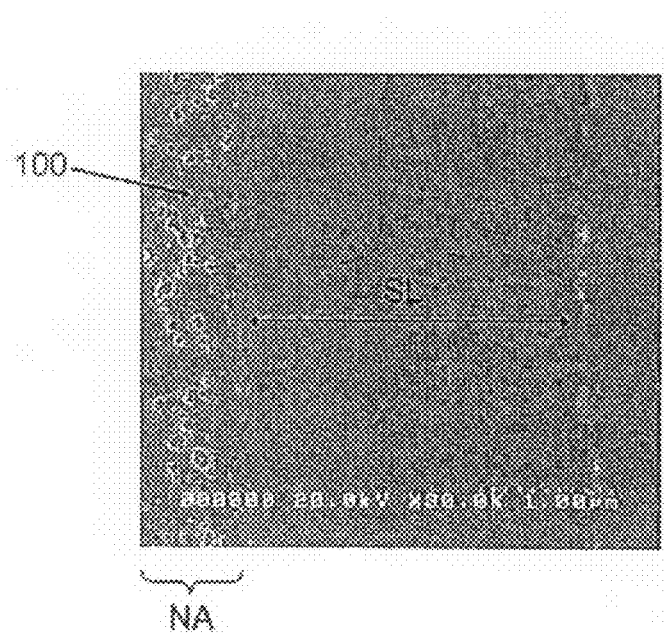

FIG. 15 is a SEM image of a channel region of a polysilicon film formed by irradiating the amorphous silicon film with an excimer laser beam having an energy density of 260 mJ/cm$^2$. In this case, the grain size formed in the channel region is approximately 2.3 μm.

Figure 16:
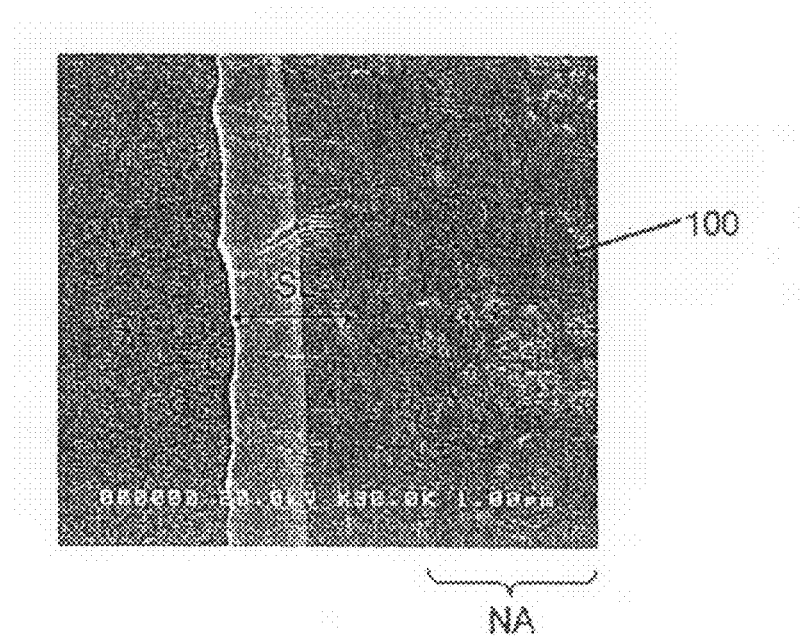

FIG. 16 is a SEM image of a channel region of a polysilicon film formed by irradiating the amorphous silicon film with an excimer laser beam having an energy density of 280 mJ/cm$^2$. In this case, the grain size formed in the channel region is approximately 1.3 μm.

Figure 17:
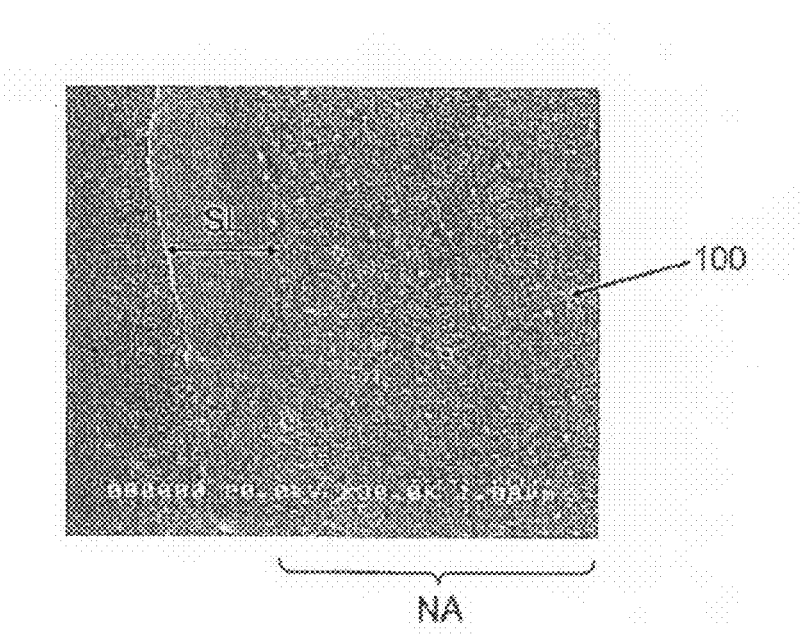

FIG. 17 is a SEM image of a channel region of a polysilicon film formed by irradiating the amorphous silicon film with an excimer laser beam having an energy density of 300 mJ/cm$^2$. In this case, the grain size formed in the channel region is approximately 0.5 μm.

Figure 18:
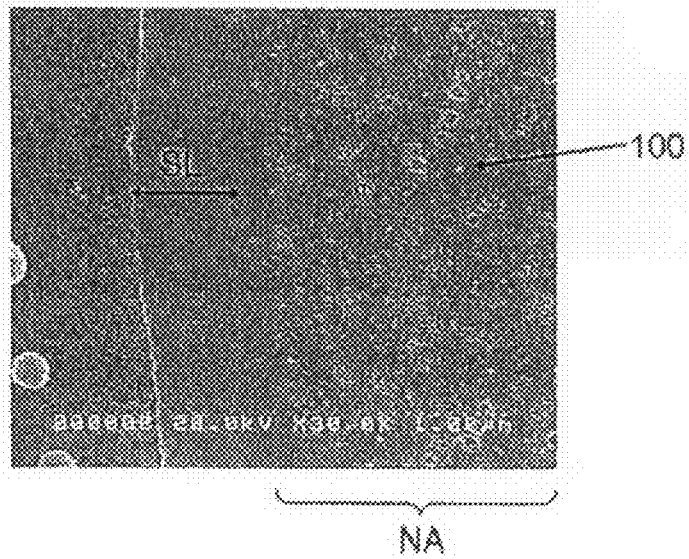

FIG. 18 is a SEM image of a channel region of a polysilicon film formed by irradiating the amorphous silicon film with an excimer laser beam having an energy density of 320 mJ/cm$^2$. In this case, the grain size formed in the channel region is approximately 0.5 μm.

Figure 19:
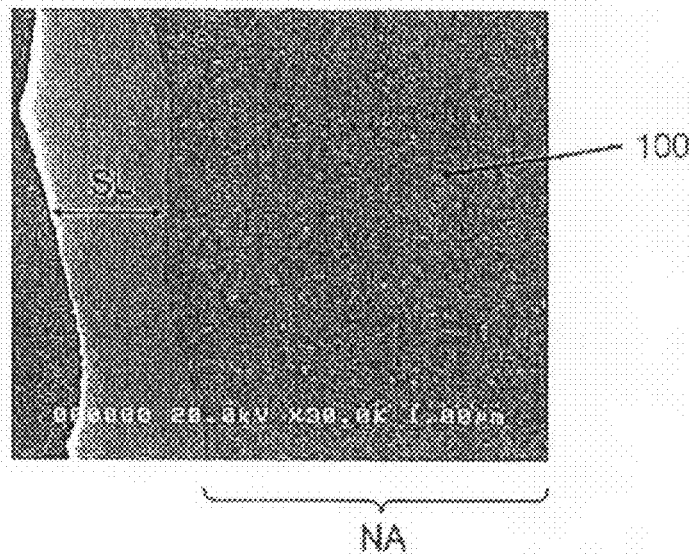

FIG. 19 is a SEM image of a channel region of a polysilicon film formed by irradiating the amorphous silicon film with an excimer laser beam having an energy density of 340 mJ/cm$^2$. In this case, the grain size formed in the channel region is approximately 0.5 μm.

From FIGS. 14 through 19, it is seen that a desirable energy density of the excimer laser beam incident on the amorphous silicon film for forming the polysilicon film is between about 240 to 280 mJ/cm$^2$, which is consistent with methods described in the embodiments of the present invention.

A polysilicon film, a thin film transistor including a polysilicon film, and a method of manufacturing a thin film transistor according to an embodiment of the present invention may exhibit one or more of the following advantages. First, since the grain size (greater than about 0.5 μm) of the polysilicon film, which may be used as the channel region, is much larger than in the conventional art, a high field effect mobility can be obtained.

Second, since the process for crystallizing the amorphous silicon film may be performed at room temperature using a laser beam, the grain size formed in the channel region of the polysilicon film can easily be controlled and the grain can uniformly be formed.

Third, a thin film transistor may be formed on a variety of substrates because it is formed in a low temperature process using a laser beam.

Fourth, there is no restriction to use a conventional method of forming a thin film transistor process because a conventional excimer laser or a solid state Nd-YAG laser may be used.

Fifth, a desired size of grains may be obtained using a single pulse of a laser, not multiple pulses, and therefore, a conventional substrate control device is unnecessary, thereby reducing manufacturing cost.

Exemplary embodiments of the present invention have been disclosed herein and, although specific terms are employed, they are used and are to be interpreted in a generic and descriptive sense only and not for purpose of limitation. For example, one skilled in the art could apply the technique of transforming an amorphous silicon film into a polysilicon film having a larger grain size not only to manufacturing a thin film transistor, as described herein, but also to manufacturing other devices that use a polysilicon film. Accordingly, it will be understood by those of ordinary skill in the art that various changes in form and details may be made without departing from the spirit and scope of the present invention as set forth in the following claims.

What is claimed is:

1. A method of manufacturing a thin film transistor, comprising:

Forming a first heat conduction film on a substrate;

Forming a second heat conduction film adjacent to the first heat conduction film, the second heat conduction film having a lower thermal conductivity than the first heat conduction film;

forming a polysilicon film in direct contact with at least one surface of the second heat conduction film and in direct contact with at least one surface of the first heat conduction film, wherein the polysilicon film is formed on the first and second heat conduction films and includes a source region and a drain region; and forming a gate stack on the polysilicon film formed on the second heat conduction film.

2. The method as claimed in claim 1, wherein forming the second heat conduction film adjacent to the first heat conduction film comprises forming the second heat conduction film on a predetermined region of the first heat conduction film.

3. The method as claimed in claim 1, wherein forming the second heat conduction film adjacent to the first heat conduction film comprises replacing a portion of the first heat conduction film with the second heat conduction film, thereby forming a noncontiguous first heat conduction film.

4. The method as claimed in claim 3, wherein replacing the portion of the first heat conduction film with the second heat conduction film comprises:

forming a photo-sensitive pattern exposing a portion of the first heat conduction film on the first heat conduction film;

removing the exposed portion of the first heat conduction film to form the noncontiguous first heat conduction film;

forming the second heat conduction film in the portion where the exposed portion of the first heat conduction film is removed; and removing the photo-sensitive pattern.

5. The method as claimed in claim 1, wherein the substrate is a film selected from the group consisting of a semiconductor substrate, a glass substrate, and a plastic substrate.

6. The method as claimed in claim 1, further comprising forming a buffer film between the substrate and the first heat conduction film.

7. The method as claimed in claim 1, wherein the first heat conduction film is a film selected from the group consisting of an insulating film, a semiconductor film, a metal film, and a silicon carbide (SiC) film.

8. The method as claimed in claim 1, wherein the second heat conduction film is a film selected from the group consisting of an organic material film and an inorganic material film.

9. The method as claimed in claim 1, wherein forming the polysilicon film comprises:

forming an amorphous silicon film covering the second heat conduction film and the first heat conduction film; and transforming the amorphous silicon film into a polysilicon film.

10. The method as claimed in claim 9, further comprising forming a capping film on the amorphous silicon film.

11. The method as claimed in claim 10, wherein transforming the amorphous silicon film into the polysilicon film comprises irradiating the amorphous silicon film with a single pulse of a laser beam having a predetermined energy density through the capping film.

12. The method as claimed in claim 11, further comprising removing the capping film after irradiating the amorphous silicon film.

13. The method as claimed in claim 9, wherein transforming the amorphous silicon film into the polysilicon film comprises irradiating the amorphous silicon film with a single pulse of a laser beam having a predetermined energy density.

14. A method of forming a polysilicon film, comprising:

forming a lower film including a first heat conduction film and a second heat conduction film, the second heat conduction film having a lower thermal conductivity than the first heat conduction film;

forming an amorphous silicon film in direct contact with at least one surface of the second heat conduction film and in direct contact with at least one surface of the first heat conduction film, wherein the amorphous silicon film is formed on an upper surface of the first and second heat conduction films and includes a source region and a drain region; and crystallizing the amorphous silicon film.

15. The method as claimed in claim 14, wherein forming the lower film comprises depositing the second heat conduction film on a predetermined region of the first heat conduction film.

16. The method as claimed in claim 14, wherein forming the lower film comprises replacing a portion of the first heat conduction film with the second heat conduction film.

17. The method as claimed in claim 14, further comprising forming a capping film on the amorphous silicon film after forming the amorphous silicon film.

18. The method as claimed in claim 17, wherein crystallizing the amorphous silicon film comprises irradiating the amorphous silicon film with a laser beam having a predetermined energy density through the capping film.

19. The method as claimed in claim 18, further comprising removing the capping film after irradiating the amorphous silicon film.

20. The method as claimed in claim 14, wherein crystallizing the amorphous silicon film comprises irradiating the amorphous silicon film with a laser beam having a predetermined energy density.

* * * * *